(12) United States Patent
Takao et al.

(10) Patent No.: US 11,038,500 B2
(45) Date of Patent: Jun. 15, 2021

(54) GATE RESISTANCE ADJUSTMENT DEVICE

(71) Applicant: KABUSHIKI KAISHA TOSHIBA, Minato-ku (JP)

(72) Inventors: Kazuto Takao, Tsukuba (JP); Yusuke Hayashi, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/564,580

(22) Filed: Sep. 9, 2019

(65) Prior Publication Data
US 2020/0220533 A1 Jul. 9, 2020

(30) Foreign Application Priority Data
Jan. 4, 2019 (JP) .............................. JP2019-000272

(51) Int. Cl.
*H03K 17/687* (2006.01)
*H03K 17/082* (2006.01)

(52) U.S. Cl.
CPC ....... *H03K 17/0828* (2013.01); *H03K 17/687* (2013.01)

(58) Field of Classification Search
CPC ........... H03K 17/0826; H03K 17/0822; H03K 17/082; H03K 17/687; H03K 17/165
See application file for complete search history.

(56) References Cited

U.S. PATENT DOCUMENTS

| 6,384,552 | B2 | 5/2002 | Shimane et al. |
| 8,749,278 | B2 | 6/2014 | Saotome et al. |
| 10,505,529 | B1 | 12/2019 | Takao |
| 10,622,988 | B2 * | 4/2020 | Sasaki .................... H02M 1/088 |
| 2015/0318848 | A1 * | 11/2015 | Kandah ................ H03K 17/165 363/132 |

(Continued)

FOREIGN PATENT DOCUMENTS

| EP | 2 579 172 A1 | 4/2013 |
| JP | H5-235722 A | 9/1993 |
| JP | 11-069779 A | 3/1999 |

(Continued)

OTHER PUBLICATIONS

Angus Bryant, "Optimisation of dV/dt-Losses Trade Off using Switchable Gate Resistance", Bodo's Power Systems, Jun. 2018, 3 pages.

*Primary Examiner* — Patrick C Chen
(74) *Attorney, Agent, or Firm* — Oblon, McClelland, Maier & Neustadt, L.L.P.

(57) ABSTRACT

A gate resistance adjustment device has a waveform input unit that inputs waveforms of a drain voltage or a collector voltage and a drain current or a collector current at least one of during a switching device is turned on and during the switching device is turned off, an extraction unit that extracts time required for at least one of turning on or off the switching device and a steady-state drain current or a steady-state collector current of the switching device based on the waveforms input by the waveform input unit, a calculator that calculates a gate resistance of the switching device based on the time and the steady-state drain current or the steady-state collector current that are extracted by the extraction unit, and a setting unit that sets a gate resistance calculated by the calculator in the switching device.

10 Claims, 9 Drawing Sheets

(56) References Cited

U.S. PATENT DOCUMENTS

2020/0021282 A1* 1/2020 Yamamoto ........... H03K 17/168

FOREIGN PATENT DOCUMENTS

| | | |
|---|---|---|
| JP | 2001-169407 A | 6/2001 |
| JP | 2006-345635 A | 12/2006 |
| JP | 2011-253434 A | 12/2011 |
| JP | 2012-39459 A | 2/2012 |
| JP | 2018-93446 A | 6/2018 |
| JP | 2020-39219 A | 3/2020 |

* cited by examiner

GATE RESISTANCE ADJUSTMENT DEVICE

CROSS REFERENCE TO RELATED APPLICATIONS

This application is based upon and claims the benefit of priority from the prior Japanese Patent Application No. 2019-272, filed on Jan. 4, 2019, the entire contents of which are incorporated herein by reference.

FIELD

Embodiments of the present disclosure relate to a gate resistance adjustment device.

BACKGROUND

A power semiconductor device represented by a power MOSFET switches a large current. Consequently, if the surge voltage due to noise is superimposed on the gate voltage or drain voltage of the power semiconductor device, the power semiconductor device may be broken. As the surge voltage is also the source of noise generation, the surge voltage needs to be reduced as much as possible.

In order to solve the problem, a measure is taken. According to the measure, a gate resistance connected to the gate of the power semiconductor device is adjusted to reduce the surge voltage. The larger the gate resistance is, the longer the turn-on time and turn-off time of the power semiconductor device are, resulting in an increase in switching loss. On the other hand, the smaller the gate resistance is, the shorter the turn-on time and turn-off time are. However, the power semiconductor device is easily affected by the surge voltage.

As described above, there is a trade-off between the surge voltage and the switching loss. As of this moment, it is common to adjust the gate resistance by trial and error while monitoring the voltage and current waveforms of the gate and the drain of the power semiconductor device. As the theoretical method of optimizing the gate resistance has not been established, the optimization of the gate resistance relies on experience and intuition of a circuit designer. In actuality, it takes a lot of time to adjust the gate resistance.

BRIEF DESCRIPTION OF THE DRAWINGS

FIG. 4 illustrates waveform diagrams of a gate voltage, a drain current, and a drain voltage during the power MOSFET is turned on;

DETAILED DESCRIPTION

According to one embodiment, a gate resistance adjustment device has:

a waveform input unit that inputs waveforms of a drain voltage or a collector voltage and a drain current or a collector current at least one of during a switching device is turned on and during the switching device is turned off;

an extraction unit that extracts time required for at least one of turning on or off the switching device and a steady-state drain current or a steady-state collector current of the switching device based on the waveforms input by the waveform input unit;

a calculator that calculates a gate resistance of the switching device based on the time and the steady-state drain current or the steady-state collector current that are extracted by the extraction unit; and a setting unit that sets a gate resistance calculated by the calculator in the switching device.

Embodiments of the present disclosure will be described below with reference to the drawings. Characteristic configurations and operations of a gate resistance adjustment device, a power supply device, and a gate resistance design device will be mainly described in the following embodiments. However, the gate resistance adjustment device, the power supply device, and the gate resistance design device may include configurations and operations omitted in the following description.

First Embodiment

Figure 1:
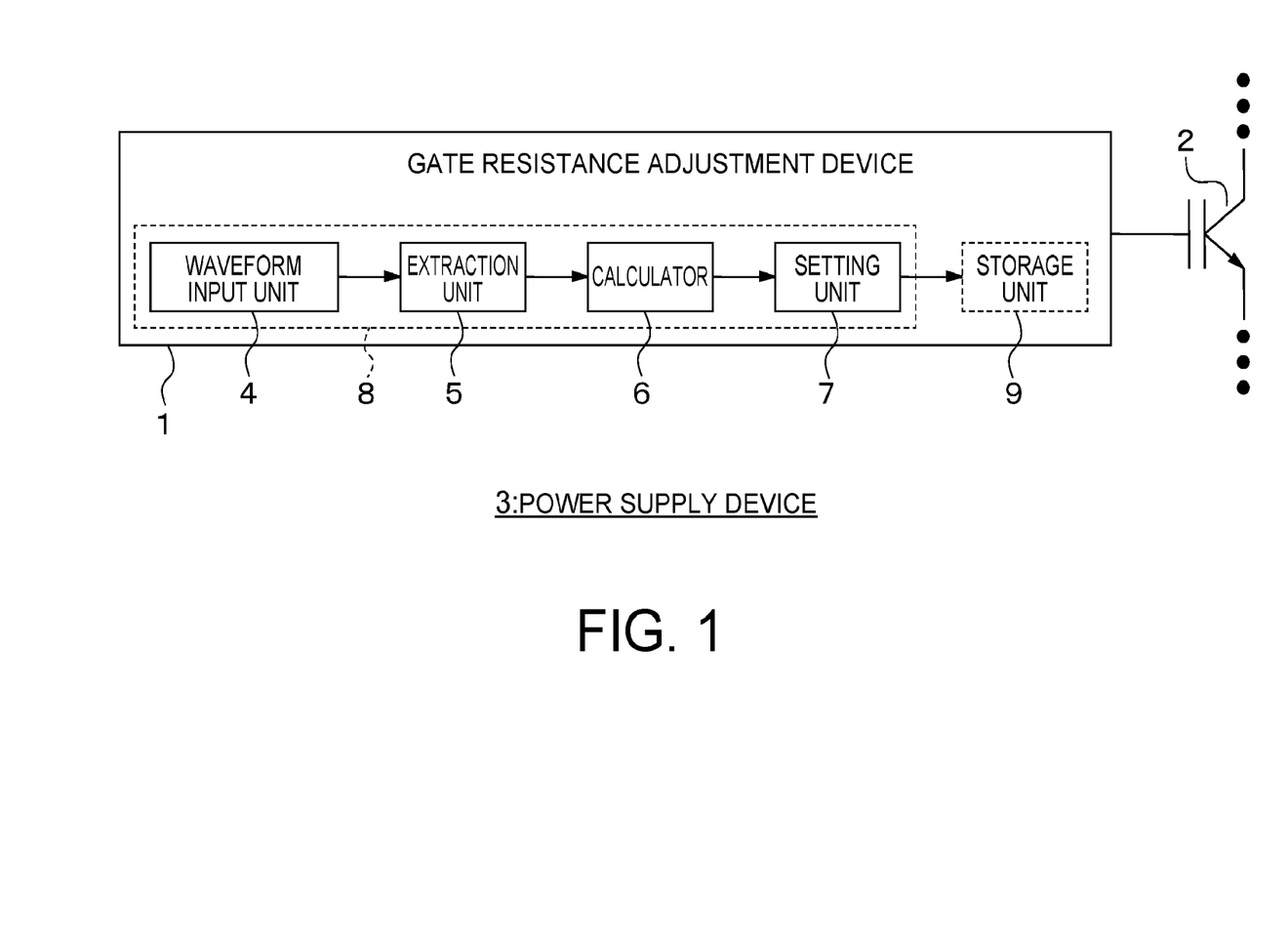
FIG. 1 is a block diagram of a schematic configuration of a gate resistance adjustment device according to a first embodiment.

FIG. 1 is a block diagram of a schematic configuration of a gate resistance adjustment device 1 according to a first embodiment. The gate resistance adjustment device 1 illustrated in FIG. 1 has a function to adjust a gate resistance of a power semiconductor device such as a power MOSFET and an IGBT. In the following description, the power semiconductor device is collectively referred to as "switching device 2". The gate resistance adjustment device 1 is used by being connected to the switching device 2. The switching device 2 is disposed in a power supply device 3, for example. Consequently, the gate resistance adjustment device 1 may also be built in the power supply device 3. Alternatively, the gate resistance adjustment device 1 may be disposed to be separated from the power supply device 3.

The gate resistance adjustment device 1 illustrated in FIG. 1 includes a waveform input unit 4, an extraction unit 5, a calculator 6, and a setting unit 7. The waveform input unit 4, the extraction unit 5, and the calculator 6 also constitute a gate resistance design device 8.

The waveform input unit 4 inputs waveforms of a drain voltage or a collector voltage and a drain current or a collector current at least one of during the switching device 2 is turned on and during the switching device 2 is turned off.

Figure 2:
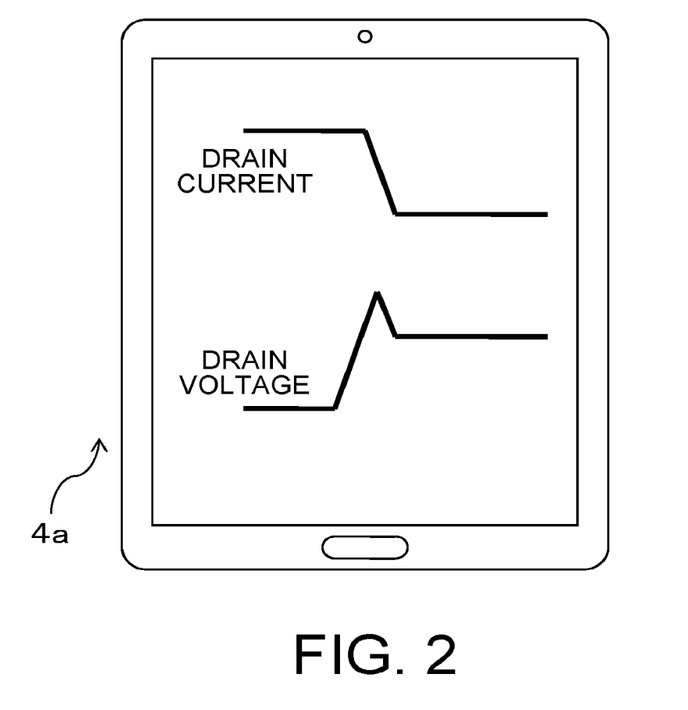
FIG. 2 illustrates an example of a waveform input unit.

FIG. 2 illustrates an example of the waveform input unit 4. A user such as a circuit designer inputs the waveforms of the drain voltage and the drain current through various input devices 4a such as user's smartphone and PC. The waveform input may be hand-written. Alternatively, the handwritten waveform input by the user may be automatically converted to an approximate line or curve waveform. Alternatively, several waveform candidates may be displayed to be selected by the user. If the waveform input by the user is inaccurate, a gate resistance RG is not set appropriately. For this reason, a person who has the knowledge about the desired waveform of the drain voltage or the drain current during the switching device 2 is turned on or off has to input the waveform.

The user may prepare in advance a tool for inputting the waveform of the drain voltage or the drain current and input the waveform using the tool. For example, the user may input the waveform through an application software (hereinafter, "application") in the user's smartphone. In this case, when the application is launched, the two-dimensional coordinate plane whose horizontal axis represents time and whose vertical axis represents a voltage or a current is displayed. The user may input the waveform using the two-dimensional coordinate plane through a pen tool prepared in advance.

The extraction unit 5 illustrated in FIG. 1 extracts the time required for at least one of turning on or off the switching device 2 and a steady-state drain current or a steady-state collector current of the switching device 2 based on the waveform input by the waveform input unit 4. Specific information extracted by the extraction unit 5 is not limited to the time and the drain current (or collector current) described above. For example, a direct bias voltage, a drain voltage, a collector voltage, a steady-state gate voltage, or a steady-state gate current may be extracted. As described later, the information extracted by the extraction unit 5 depends on parameters of a model equation used by the calculator 6.

The calculator 6 calculates the gate resistance RG of the switching device 2 based on the time and the steady-state drain current or the steady-state collector current that are extracted by the extraction unit 5. The calculator 6 may calculate the gate resistance RG of the switching device 2 based on information about the electrical characteristics of the switching device 2 in addition to the time and the steady-state drain current or the steady-state collector current that are extracted by the extraction unit 5. The information about the electrical characteristics may include a threshold voltage Vth, a transconductance gm, gate-source capacitance, and gate-drain capacitance of the switching device 2.

More specifically, the calculator 6 may calculate the gate resistance RG during the switching device 2 is turned on and the gate resistance RG during the switching device 2 is turned off based on different model equations. Each of the model equations may be calculated based on an equivalent circuit of the switching device 2. Alternatively, the model equations may be generated so as to fit experimental waveforms during the switching device 2 is turned on and during the switching device 2 is turned off.

In a first time period during which the switching device 2 is turned on, the calculator 6 may calculate the gate resistance RG using a first model equation based on a time change of the drain current or the collector current. In a second time period following the first time period during which the switching device is turned on, the calculator 6 may calculate the gate resistance RG using a second model equation based on a time change of the drain voltage or the collector voltage. Moreover, in a third time period during which the switching device 2 is turned off, the calculator 6 may calculate the gate resistance RG using a third model equation based on the time change of the drain current or the collector current. In a fourth time period following the third time period during which the switching device is turned off, the calculator 6 may calculate the gate resistance RG using a fourth model equation based on the time change of the drain voltage or the collector voltage.

The setting unit 7 sets the gate resistance RG calculated by the calculator 6 in the switching device 2. As described above, when the calculator 6 calculates different gate resistances RG in the first time period and the second time period during which the switching device 2 is turned on, the setting unit 7 sets the gate resistance RG so as to be switched between the first time period and the second time period. Similarly, when the calculator 6 calculates different gate resistances RG in the third time period and the fourth time period during which the switching device 2 is turned off, the setting unit 7 sets the gate resistance RG so as to be switched between the third time period and the fourth time period.

The gate resistance adjustment device 1 illustrated in FIG. 1 may include a storage unit 9. The storage unit 9 stores the gate resistance RG calculated by the calculator 6. The setting unit 7 reads the gate resistance RG stored in the storage unit 9 and sets the gate resistance RG in the switching device 2.

Figure 3:
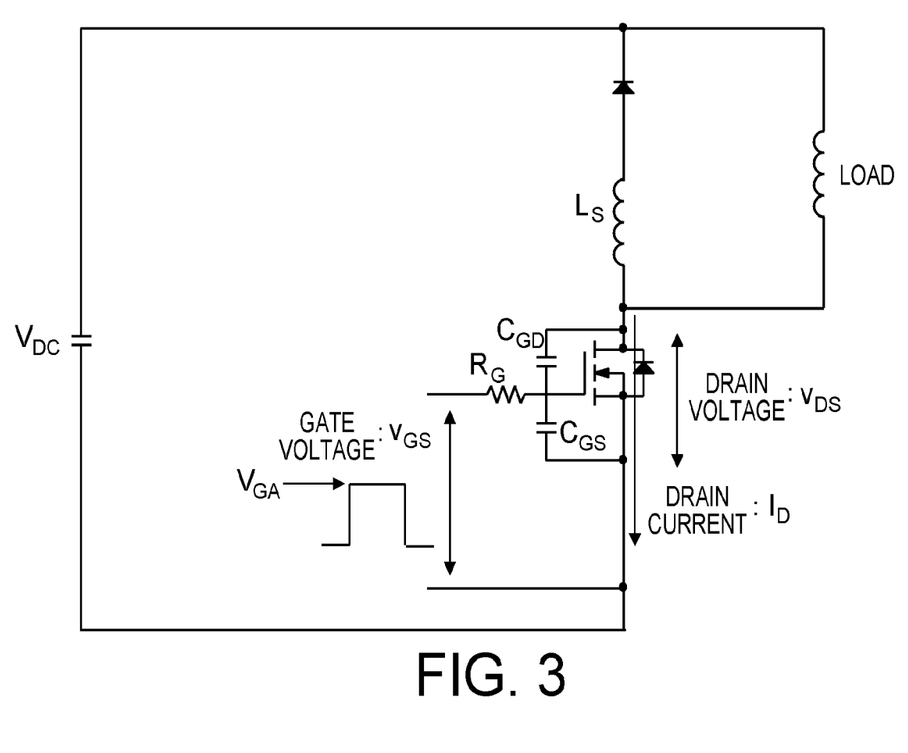
FIG. 3 is an equivalent circuit diagram of a power converter including an equivalent circuit diagram of a power MOSFET.

Next, an operation of the gate resistance adjustment device 1 according to the first embodiment will be described. FIG. 3 is an equivalent circuit diagram of a power converter including an equivalent circuit diagram of a power MOSFET. As illustrated in FIG. 3, the power MOSFET equivalently includes the gate resistance RG, gate-drain capacitance CGD, gate-source capacitance CGS. Equivalent circuits of the power MOSFET other than that illustrated in FIG. 3 may be possible. Components constituting the equivalent circuit may be changed.

Figure 4:
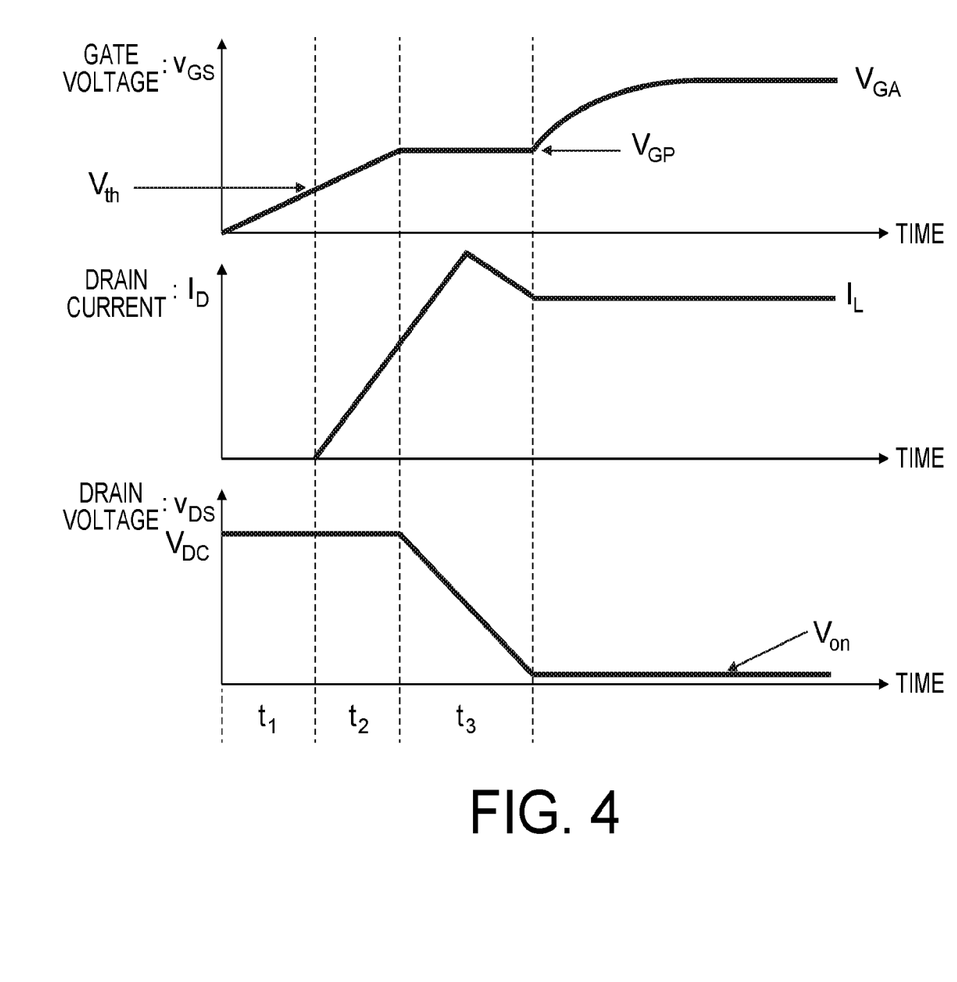

FIG. 4 illustrates waveform diagrams of a gate voltage, a drain current, and a drain voltage during a power MOSFET is turned on. A time period t1 illustrated in FIG. 4 is a time period during which the gate voltage starts to increase. In this time period, the gate has become higher than a threshold voltage Vth of the power MOSFET. A time period t2 is a time period during which the drain current starts to increase. During the time periods t1 to t2, the drain voltage remains high. A time period t3 is a time period during which the drain voltage starts to decrease. In this time period, the drain current reaches a peak value and then decreases. The power MOSFET is turned on during the time periods t2 to t3. After the time period t3, the drain current is a steady-state current IL and the drain voltage is a steady-state voltage Von. Lagging behind the drain current and the drain voltage, the gate voltage has become a steady-state voltage VGA.

A user inputs the waveforms of the drain voltage and the drain current illustrated in FIG. 4 through the waveform input unit 4. When the waveforms illustrated in FIG. 4 are input, the gate resistance adjustment device 1 and the gate resistance design device 8 according to the present embodiment automatically adjust the gate resistance RG. The calculator 6 calculates the gate resistance RG using a model equation. The method of generating the model equation will be described below.

The gate voltage VGS during the time period t1 illustrated in FIG. 4 is calculated by the following Equation (1). In Equation (1), t denotes time, VGA denotes a steady-state gate voltage during a switching device is turned on, CGS denotes gate-source capacitance, and CGD denotes gate-drain capacitance.

$$V_{GS}(t) = V_{GA}\left\{1 - \exp\frac{-t}{R_G(C_{GS} + C_{GD})}\right\} \qquad (1)$$

When Equation (1) is transformed by putting t=t1 in Equation (1), the following Equation (2) is obtained.

$$t_1 = R_G(C_{GS} + C_{GD})\ln\frac{1}{1 - \frac{V_{th}}{V_{GA}}} \quad (2)$$

The drain current during the time period t2 illustrated in FIG. 4 is calculated by the following Equation (3). In Equation (3), gm denotes the transconductance of the power MOSFET and Vth denotes the threshold voltage of the power MOSFET.

$$I_D(t) = g_m(V_{GS} - V_{th}) = g_m\left[V_{GA}\left\{1 - \exp\frac{-t}{R_G(C_{GS} + C_{GD})}\right\} - V_{th}\right] \quad (3)$$

When Equation (3) is transformed by putting t=t2 in Equation (3), the following Equation (4) is obtained.

$$t_2 = R_G(C_{GS} + C_{GD})\ln\frac{g_m V_{GA}}{g_m(V_{GA} - V_{th}) - I_L} \quad (4)$$

When Equation (4) is transformed, the gate resistance RG is represented by the following Equation (5).

$$R_G = \frac{t_2}{(C_{GS} + C_{GD})\ln\frac{g_m V_{GA}}{g_m(V_{GA} - V_{th}) - I_L}} \quad (5)$$

Equation (5) is a model equation in the time period t2 during which the power MOSFET is turned on. As can be seen from the right side of Equation (5), to calculate the gate resistance RG in Equation (5), it is necessary to have the gate-source capacitance CGS, the gate-drain capacitance CGD, the transconductance gm, the steady-state gate voltage VGA, the threshold voltage Vth of the power MOSFET, the steady-state drain current IL, and the time period t2.

The gate voltage during the time period t3 illustrated in FIG. 4 is calculated by the following Equation (6). A steady-state drain current is denoted by IL.

$$V_{GS}(t) = V_{th} + \frac{I_L}{g_m} = V_{GP} \quad (6)$$

The gate current during the time period t3 illustrated in FIG. 4 is calculated by the following Equation (7).

$$I_G = \frac{V_{GA} - V_{GP}}{R_G} = \frac{1}{R_G}\left\{V_{GA} - \left(V_{th} + \frac{I_L}{g_m}\right)\right\} = C_{GD}\frac{dV_{GD}}{dt} \quad (7)$$

VGS=VGP in the time period t3, and thus Equation (7) can be transformed into the following Equation (8).

$$\frac{dV_{GD}}{dt} = \frac{dV_{DS}}{dt} = \frac{V_{GA} - \left(V_{th} + \frac{I_L}{g_m}\right)}{R_G C_{GD}} \quad (8)$$

By integrating both sides of Equation (8) with the time t, the following Equation (9) is obtained.

$$V_D(t) = V_{DC} - \left\{\frac{V_{GA} - \left(V_{th} + \frac{I_L}{g_m}\right)}{R_G C_{GD}}\right\}t \quad (9)$$

When Equation (9) is transformed by putting t=t3 in Equation (9), the following Equation (10) is obtained.

$$t_3 = \frac{(V_{DC} - V_{on})R_G C_{GD}}{V_{GA} - \left(V_{th} + \frac{I_L}{g_m}\right)} \quad (10)$$

When Equation (10) is transformed, the gate resistance RG is represented by the following Equation (11).

$$R_G = \frac{\left\{V_{GA} - \left(V_{th} + \frac{I_L}{g_m}\right)\right\}t_3}{(V_{DC} - V_{on})C_{GD}} \quad (11)$$

Equation (11) is a model equation in the time period t3 during which the power MOSFET is turned on. As can be seen from the right side of Equation (11), to calculate the gate resistance RG in Equation (11), it is necessary to have the direct bias voltage VDC applied while the power MOSFET is turned on, a steady-state drain voltage Von during the power MOSFET is turned on, the gate-drain capacitance CGD, the steady-state gate voltage VGA, the threshold voltage Vth of the power MOSFET, the transconductance gm, the steady-state drain current IL, and the time period t3. At least some of these parameters are extracted by the extraction unit 5 from the waveforms input by a user through the waveform input unit 4. Alternatively, the extraction unit 5 may extract some parameters (gm and Vth) based on the electrical characteristics of the power MOSFET used.

Figure 5:
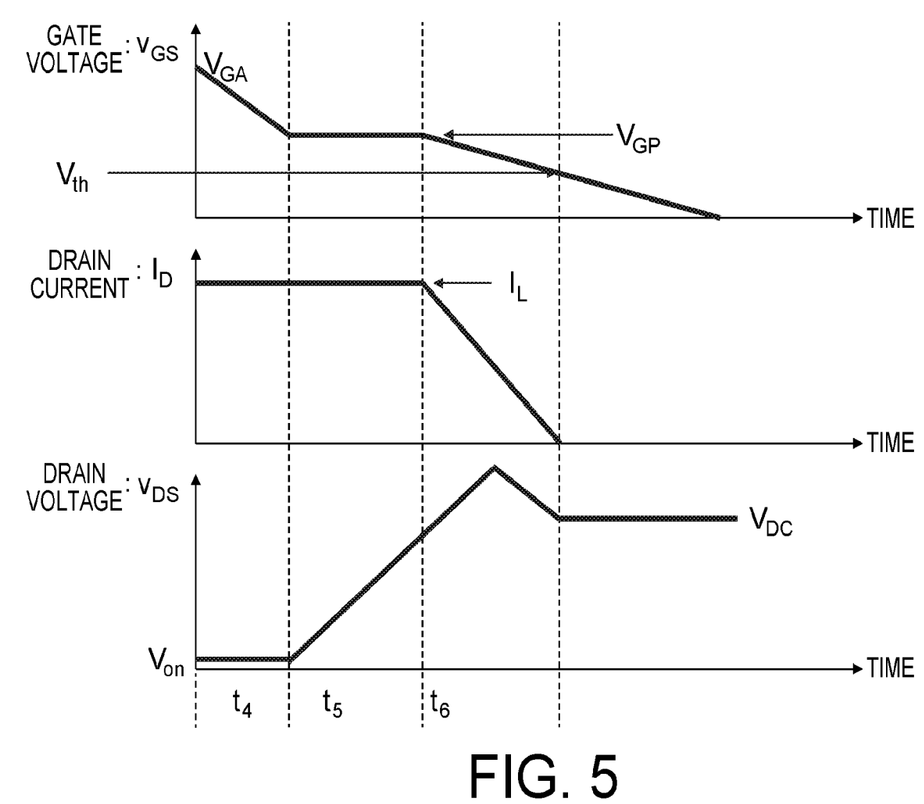
FIG. 5 illustrates waveform diagrams of the gate voltage, the drain current, and the drain voltage during the power MOSFET is turned off.

FIG. 5 illustrates waveform diagrams of a gate voltage, a drain current, and a drain voltage during a power MOSFET is turned off. A time period t4 illustrated in FIG. 5 is a time period during which the gate voltage starts to decrease. A time period t5 is a time period during which the drain voltage starts to increase. During the time periods t4 to t5, the steady-state drain current IL flows. A time period t6 is a time period during which the drain current starts to decrease. In this time period, the gate voltage has become lower than the threshold voltage. In the time period t6, the drain voltage reaches a peak value and then decreases. After the time period t6, the drain voltage is the steady-state voltage VDC.

The gate voltage during the time period t4 illustrated in FIG. 5 is calculated by the following Equation (12).

$$V_{GS}(t_4) = V_{GA}\exp\frac{-t}{R_G(C_{GS} + C_{GD})} = V_{th} + \frac{I_L}{g_m} \quad (12)$$

When Equation (12) is transformed by putting t=t4 in Equation (12), the following Equation (13) is obtained.

$$t_4 = R_G(C_{GS} + C_{GD})\ln\frac{V_{GA}}{V_{th} + \frac{I_L}{g_m}} \quad (13)$$

The gate voltage during the time period t5 illustrated in FIG. 5 is calculated by the following Equation (14).

$$V_{GS}(t) = V_{th} + \frac{I_L}{g_m} \quad (14)$$

The gate current during the time period t5 illustrated in FIG. 5 is calculated by the following Equation (15).

$$I_G = \frac{V_{GS}}{R_G} = \frac{V_{th} + \frac{I_L}{g_m}}{R_G} \quad (15)$$

The following Equation (16) holds.

$$\frac{dV_{DS}}{dt} = \frac{dV_{GD}}{dt} = \frac{I_G}{C_{GD}} \quad (16)$$

By substituting Equation (15) for IG in Equation (16) and integrating both sides of Equation (16) with the time t, the following Equation (17) holds.

$$V_D(t) = V_{on} + \frac{1}{R_G C_{GD}}\left(V_{th} + \frac{I_L}{g_m}\right)t \quad (17)$$

When Equation (17) is transformed by putting t=t5 in Equation (17), the following Equation (18) is obtained.

$$t_5 = \frac{R_G C_{GD}(V_{DC} - V_{on})}{V_{th} + \frac{I_L}{g_m}} \quad (18)$$

When Equation (18) is transformed, the gate resistance RG is represented by the following Equation (19).

$$R_G = \frac{t_5\left(V_{th} + \frac{I_L}{g_m}\right)}{C_{GD}(V_{DC} - V_{on})} \quad (19)$$

Equation (19) is a model equation in the time period t5 during which the power MOSFET is turned off. As can be seen from the right side of Equation (19), to calculate the gate resistance RG in Equation (19), it is necessary to have the gate-drain capacitance CGD, the direct bias voltage VDC, the steady-state drain voltage Von, the threshold voltage Vth of the power MOSFET, the transconductance gm, the steady-state drain current IL, and the time period t5.

The gate voltage during the time period t6 illustrated in FIG. 5 is calculated by the following Equation (20).

$$V_{GS}(t) = \left(V_{th} + \frac{I_L}{g_m}\right)\exp\frac{-t}{R_G(C_{GS} + C_{GD})} \quad (20)$$

The drain current during the time period t6 illustrated in FIG. 5 is calculated by the following Equation (21).

$$I_D(t) = g_m(V_{GS} - V_{th}) = (I_L + g_m V_{th})\exp\frac{-t}{R_G(C_{GS} + C_{GD})} - g_m V_{th} \quad (21)$$

When Equation (21) is transformed by putting t=t6 in Equation (21), the following Equation (22) is obtained.

$$t_6 = R_G(C_{GS} + C_{GD})\ln\left(\frac{I_L}{g_m V_{th}} + 1\right) \quad (22)$$

When Equation (22) is transformed, the gate resistance RG is represented by the following Equation (23).

$$R_G = \frac{t_6}{(C_{GS} + C_{GD})\ln\left(\frac{I_L}{g_m V_{th}} + 1\right)} \quad (23)$$

Equation (23) is a model equation in the time period t6 during which the power MOSFET is turned off. As can be seen from the right side of Equation (23), to calculate the gate resistance RG in Equation (23), it is necessary to have the gate-source capacitance CGS, the gate-drain capacitance CGD, the transconductance gm, the threshold voltage Vth of the power MOSFET, the steady-state drain current IL, and the time period t6.

In the example described above, while the power MOSFET is turned on, the model equation of the gate resistance RG in the time period t2 is different from that in the time period t3. While the power MOSFET is turned off, the model equation of the gate resistance RG in the time period t5 is different from that in the time period t6. Consequently, the setting unit 7 switches the gate resistance RG between the time period t2 and the time period t3 during the power MOSFET is turned on, and switches the gate resistance RG between the time period t5 and the time period t6 during the power MOSFET is turned off.

Figure 6A:
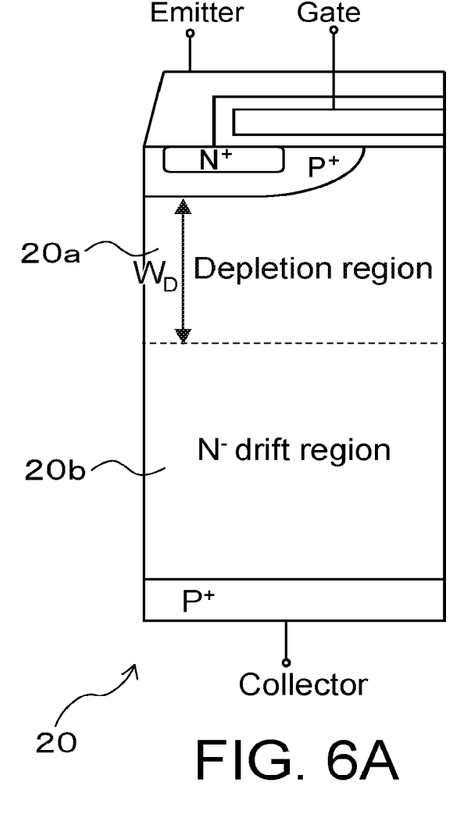
FIG. 6A is a cross-sectional view of an IGBT and FIG. 6B is an equivalent circuit diagram of the IGBT.
Figure 6B:
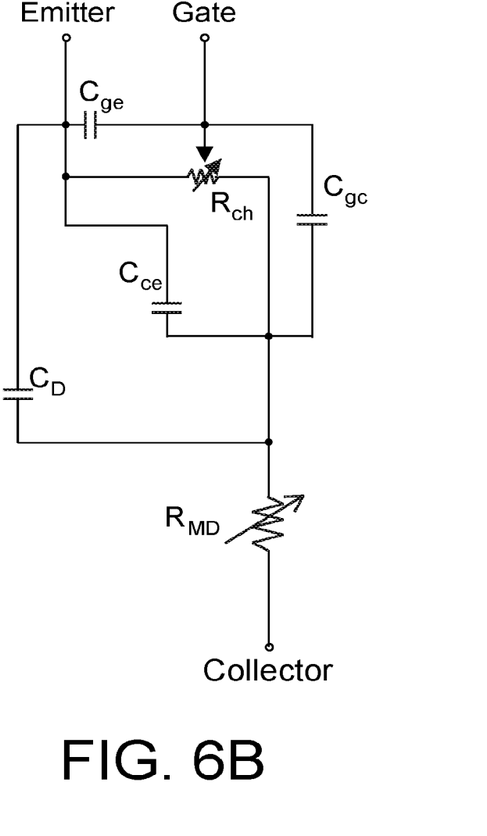

The gate resistance adjustment device 1 according to the present embodiment can be used when the switching device 2 is an IGBT 20. FIG. 6A is a cross-sectional view of the IGBT 20 and FIG. 6B is an equivalent circuit diagram of the IGBT 20. As illustrated in FIG. 6A, the IGBT 20 includes a gate, an emitter, and a collector. A depletion region 20a and an N-drift region 20b are disposed between the gate and the collector. As illustrated in FIG. 6B, the IGBT 20 equivalently includes gate-emitter capacitance Cge, gate-collector capacitance Cgc, collector-emitter capacitance Cce, diffusion capacitance CD, a channel resistance Rch, and a conductivity-modulated drift resistance RMD.

Figure 7:
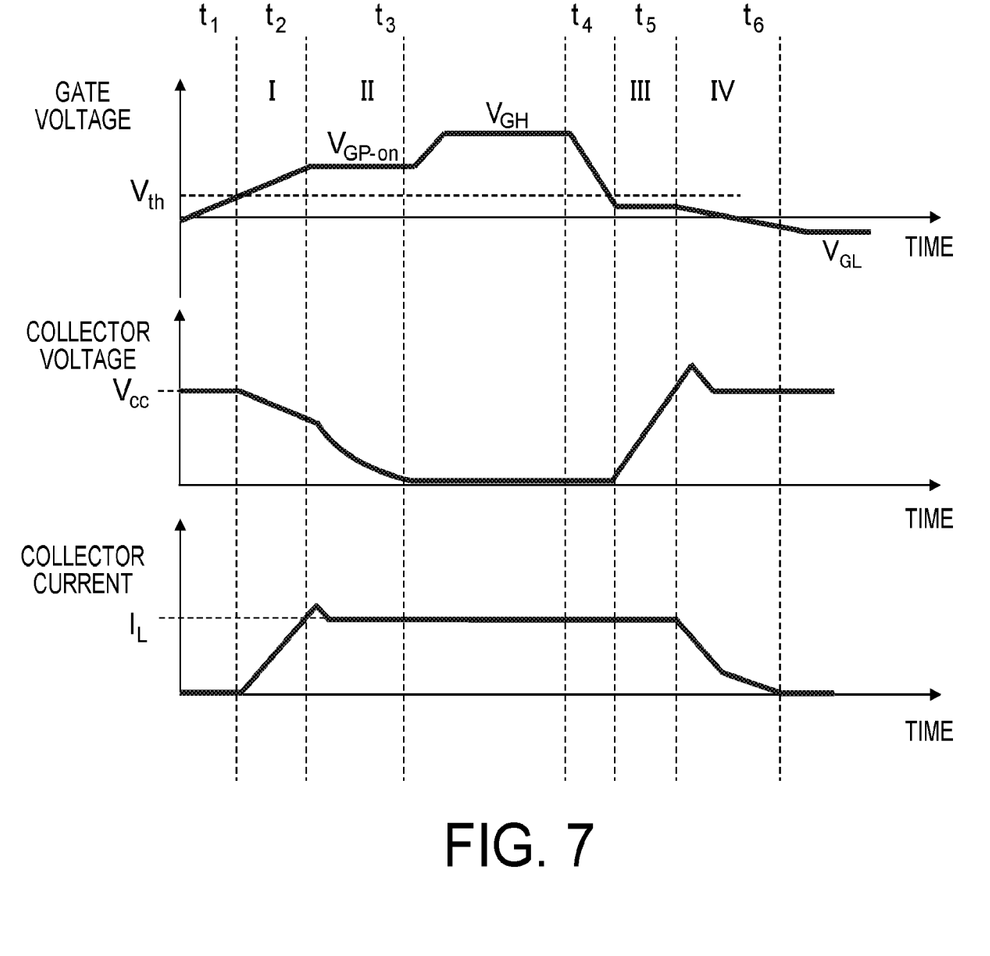
FIG. 7 illustrates waveform diagrams of a gate voltage, a collector voltage, and a collector current during the IGBT is turned on and during the IGBT is turned off.

FIG. 7 illustrates waveform diagrams of a gate voltage, a collector voltage, and a collector current during the IGBT 20 is turned on and during the IGBT 20 is turned off. In FIG. 7, time periods t1 to t3 are turn-on periods and time periods t4 to t6 are turn-off periods.

The turn-on gate resistance RG during the time period t2 is represented by the following Equation (24), and the turn-on gate resistance RG during the time period t3 is represented by the following Equation (25).

$$R_G = \frac{t_2}{(C_{GS}+C_{GD})\ln\frac{g_m V_{GA}}{g_m(V_{GA}-V_{th})-I_L}} \quad (24)$$

$$R_G = \frac{t_3\{V_{GA}-(V_{th}+\frac{I_L}{g_m})\}}{(V_{DC}-V_{on})C_{GC}} \quad (25)$$

CGC in Equation (25) is represented by the following Equation (26). In Equation (26), E denotes the dielectric constant of a semiconductor, AGD denotes the cross-sectional area between the gate electrode and the drain electrode, q denotes an elementary charge, and NB denotes the carrier density of a drift layer.

$$C_{GC} = \varepsilon \left(\frac{2\varepsilon v_{ce}}{qN_B}\right)^{-\frac{1}{2}} \cdot A_{GD} \quad (26)$$

The turn-off gate resistance RG during the time period t4 is represented by the following Equation (27).

$$R_G = \frac{t_4}{(C_{GS}+C_{GD})\ln\frac{V_{GA}}{V_{th}+\frac{I_L}{g_m}}} \quad (27)$$

The parameters on the right side of the equation of the gate resistance RG described above are extracted by the extraction unit 5 based on waveforms input by a user through the waveform input unit 4. The calculator 6 substitutes the parameters extracted by the extraction unit 5 for the equation of the gate resistance RG described above, thus calculating the gate resistance RG. The gate resistance RG calculated by the calculator 6 is stored in the storage unit 9 if needed. When the gate resistance RG is stored in the storage unit 9, the gate resistance RG is desirably stored so as to correspond to waveform information input by the user. As a result, when the user inputs a similar waveform thereafter, the calculator 6 does not have to calculate the gate resistance RG again and instead the corresponding gate resistance RG is read from the storage unit 9 and set.

The above description has described an example in which the model equation for calculating the gate resistance RG is generated based on the equivalent circuit of the switching device 2 and the parameters of the waveforms input by the user are substituted for the model equation generated to calculate the gate resistance RG.

The model equation for calculating the gate resistance RG is generated based on the equivalent circuit of the switching device 2 as described above. In addition to that, the model equation fitting the shape of the waveforms input by the user may be generated. For example, the model equation fitting the waveforms input by the user is represented by the following Equations (28) to (31).

$$R_G = \frac{t_2}{C \cdot D} \quad (28)$$

$$R_G = \frac{F \cdot t_3}{(V_{DC}-V_{on}) \cdot E} \quad (29)$$

$$R_G = \frac{K \cdot t_5}{J \cdot (V_{DC}-V_{on})} \quad (30)$$

$$R_G = \frac{t_6}{K \cdot L} \quad (31)$$

Equation (28) is a model equation in the time period t2 during which the power MOSFET is turned on. Equation (29) is a model equation in the time period t3 during which the power MOSFET is turned on. Equation (30) is a model equation in the time period t5 during which the power MOSFET is turned off. Equation (31) is a model equation in the time period t6 during which the power MOSFET is turned off. Fitting parameters are denoted by C, D, E, F, K, and L on the right side of the respective equations. These fitting parameters are set to fit the waveforms set by the user.

The adjustment of the gate resistance RG may be performed by the gate resistance adjustment device 1 according to the present embodiment after the switching device 2 is mounted on the power supply device 3, or may be performed at the design stage, that is, before the switching device 2 is mounted on the power supply device 3. When the gate resistance RG is adjusted after the switching device 2 is mounted on the power supply device 3, all components of the gate resistance adjustment device 1 may be mounted on a housing of the power supply device 3, for example. Alternatively, several components of the gate resistance adjustment device 1, for example, the waveform input unit 4 may be provided at some location that is different from the housing of the power supply device 3. Specifically, the waveform input unit 4 in the gate resistance adjustment device 1 may be an application in a user's smartphone. In this case, the power supply device 3 needs to have a wireless communication function to transmit a waveform input by the user launching the application to the gate resistance adjustment device 1 in the power supply device 3.

Meanwhile, when the adjustment of the gate resistance RG is performed at the design stage, that is, before the switching device 2 is mounted on the power supply device 3, the gate resistance adjustment device 1 according to the present embodiment may be used as the gate resistance design device 8. In this case, essential components of the gate resistance design device 8 are the waveform input unit 4, the extraction unit 5, and the calculator 6. The gate resistance RG calculated by the calculator 6 is stored in the storage unit 9 if needed, and set automatically or manually.

As described above, according to the first embodiment, when a user adjusts the gate resistance RG of the switching device 2, the user inputs waveforms of a drain voltage or a collector voltage and a drain current or a collector current. Parameters required to adjust the gate resistance RG are then extracted from the waveforms input by the extraction unit 5 and the parameters extracted are substituted for model equations, so that the gate resistance RG is calculated by the calculator 6. Consequently, it is possible to easily perform troublesome adjustment of the gate resistance RG. In particular, the optimum gate resistance RG is set only by the user inputting the waveform of the drain voltage or the like.

For this reason, the user does not have to adjust the gate resistance RG many times by trial and error, resulting in time and effort saving.

Second Embodiment

In a second embodiment, the gate resistance RG is set by matching waveforms input by a user.

Figure 8:
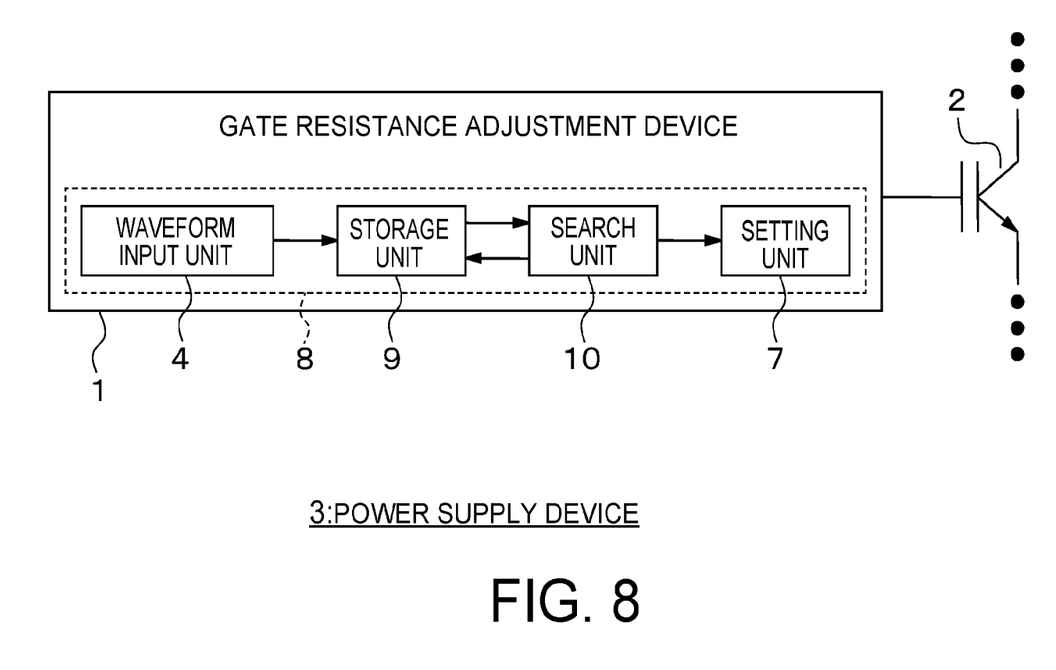
FIG. 8 is a block diagram of a schematic configuration of a gate resistance adjustment device according to a second embodiment.

FIG. 8 is a block diagram of a schematic configuration of the gate resistance adjustment device 1 according to a second embodiment. The gate resistance adjustment device 1 illustrated in FIG. 8 includes the waveform input unit 4, the storage unit 9, a search unit 10, and the setting unit 7. The waveform input unit 4, the storage unit 9, and the search unit 10 also constitute the gate resistance design device 8.

The waveform input unit 4 is similar to the waveform input unit 4 illustrated in FIG. 1. The storage unit 9 stores a plurality of waveforms so as to correspond to gate resistances RG, respectively. The storage unit 9 stores waveforms of a drain voltage or a collector voltage and a drain current or a collector current at least one of during the switching device 2 is turned on and during the switching device 2 is turned off, which are input by the waveform input unit 4. In addition to the waveforms input by the waveform input unit 4, waveforms obtained by a simulation device (not illustrated) or obtained from results of experiments conducted by a user may be stored so as to correspond to gate resistances RG, respectively.

When the user inputs the waveforms of the drain voltage and the drain current through the waveform input unit 4, for example, the search unit 10 searches the storage unit 9 for waveforms approximating the waveforms input. When the approximating waveform is found, the setting unit 7 reads the gate resistance RG corresponding to the approximating waveform from the storage unit 9 and sets the gate resistance RG.

There are several methods of causing the search unit 10 to search for a waveform. For example, image information indicating the shape of a waveform may be stored in the storage unit 9 in advance. A matching process between the shape of a waveform input by the user and the image information about the waveform stored in the storage unit 9 is then performed, so that the gate resistance RG corresponding to the best matching waveform is read.

Alternatively, parameters for characterizing a waveform, for example, parameters of model equations for calculating the gate resistance RG described above may be stored in the storage unit 9. Parameters are then extracted from a waveform input by the user, compared to the parameters stored in the storage unit 9, and the gate resistance RG corresponding to the best matching parameters may be read.

As described above, according to the second embodiment, the gate resistance RG that matches best with a waveform newly input by a user is searched for and set using the relationship between the waveform set or calculated in the past and the gate resistance RG. Consequently, the gate resistance RG does not have to be calculated every time the user inputs a waveform, and thus the gate resistance RG is easily adjusted.

Third Embodiment

In a third embodiment, the gate resistance RG is automatically adjusted based on results of noise simulations.

Figure 9:
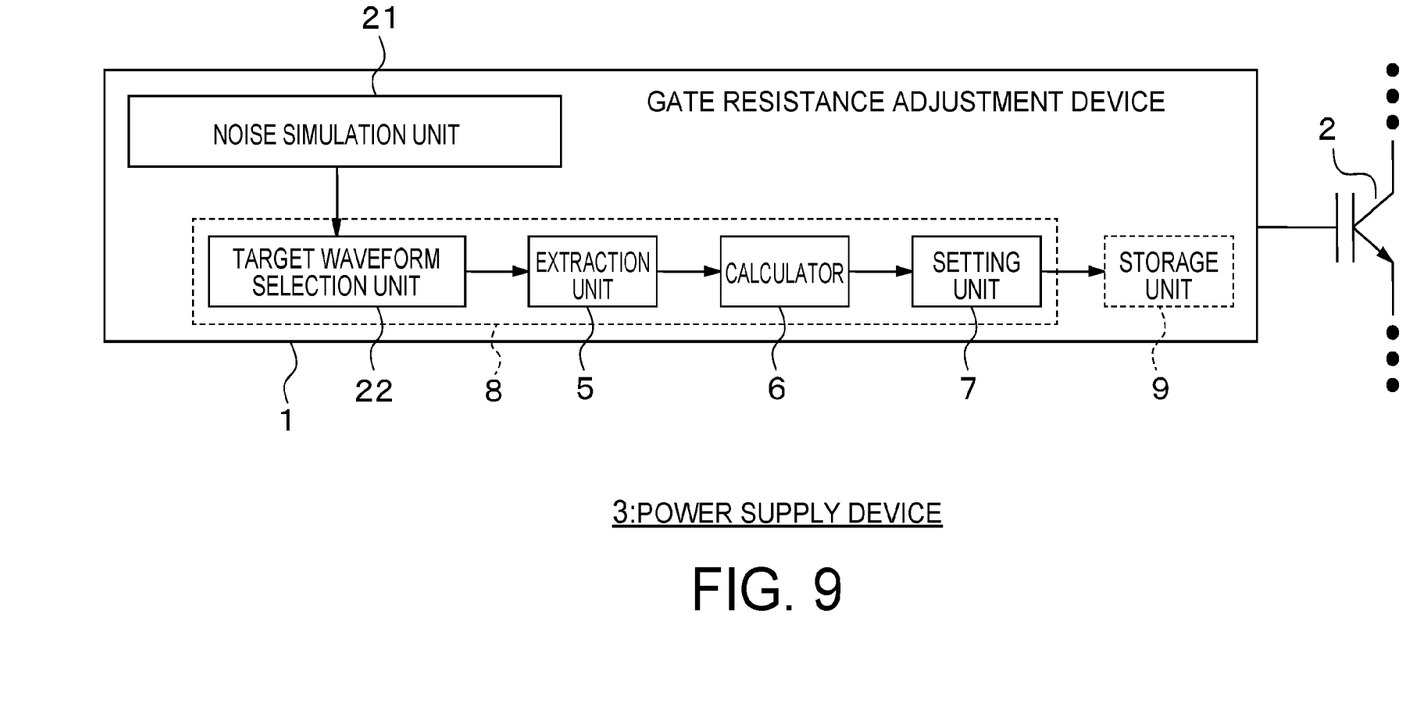
FIG. 9 is a block diagram of a schematic configuration of a gate resistance adjustment device according to a third embodiment.

FIG. 9 is a block diagram of a schematic configuration of the gate resistance adjustment device 1 according to a third embodiment. The gate resistance adjustment device 1 illustrated in FIG. 9 includes a noise simulation unit 21, a target waveform selection unit 22, the extraction unit 5, the calculator 6, and the setting unit 7.

The noise simulation unit 21 simulates noise of the switching device 2 and its peripheral circuit, that is, noise of the power supply device 3 including the switching device 2, mainly amplitudes of a surge voltage, a surge current, and a current vibration. In general, to reduce the amplitudes of the surge voltage, the surge current, and the current vibration, the gate resistance RG is increased. As the gate resistance RG is increased, however, the turn-on time and the turn-off time of the switching device 2 are extended and thus a switching loss increases. The noise such as the surge voltage is thus important to adjust the gate resistance RG.

The target waveform selection unit 22 selects a target waveform of at least one of a drain voltage or a collector voltage and a drain current or a collector current based on a result of a simulation in the noise simulation unit 21. The waveform is selected so that the switching device 2 is not broken and the switching loss is within an acceptable range. In selecting a waveform, the relationship between the noise set in the past and the waveform may be made into a table for storage and the waveform may be selected by referring to the table.

The processes of the extraction unit 5, the calculator 6, and the setting unit 7 are similar to those of the first embodiment. For example, the extraction unit 5 extracts information required to adjust the gate resistance RG, for example, the time required for at least one of turning on or off the switching device 2 and a steady-state drain current or a steady-state collector current of the switching device 2 from the waveform selected by the target waveform selection unit 22. The calculator 6 calculates the gate resistance RG based on the model equation described above.

As described above, according to the third embodiment, the waveform of the drain voltage or the drain current is automatically selected based on a result of a noise simulation. Consequently, it is not necessary to have the waveform input unit 4 described in the first and second embodiments. A user does not have to input a waveform by himself, and the gate resistance RG can be adjusted by a totally automated process.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A gate resistance adjustment device comprising:
a waveform input unit that inputs graphical waveforms that are an imitation of a drain voltage or a collector voltage and a drain current or a collector current at least one of during a switching device being turned on and during the switching device being turned off;
an extraction unit that extracts a time required for at least one of turning on or off the switching device and a steady-state drain current or a steady-state collector current of the switching device based on the waveforms input by the waveform input unit;
a calculator that calculates a gate resistance of the switching device based on the time and the steady-state drain current or the steady-state collector current that are extracted by the extraction unit; and a setting unit that sets a gate resistance calculated by the calculator in the switching device.

2. The gate resistance adjustment device according to claim 1, wherein the extraction unit extracts at least one of a direct bias voltage and a steady-state gate voltage of the switching device in addition to time required for at least one of turning on or off the switching device and a steady-state drain current or a steady-state collector current of the switching device based on the waveforms, and the calculator calculates a gate resistance of the switching device based on at least one of the direct bias voltage and the steady-state gate voltage of the switching device in addition to the time and the steady-state drain current or the steady-state collector current that are extracted by the extraction unit.

3. The gate resistance adjustment device according to claim 1, further comprising a storage unit that stores a gate resistance calculated by the calculator, wherein the setting unit reads the gate resistance stored in the storage unit and sets the gate resistance in the switching device.

4. The gate resistance adjustment device according to claim 1, wherein the calculator calculates a gate resistance of the switching device based on information about electrical characteristics of the switching device in addition to the time and the steady-state drain current or the steady-state collector current that are extracted by the extraction unit.

5. The gate resistance adjustment device according to claim 4, wherein the information about electrical characteristics includes a threshold voltage, a transconductance, gate-source capacitance, and gate-drain capacitance of the switching device.

6. The gate resistance adjustment device according to claim 1, wherein the calculator calculates the gate resistance during the switching device is turned on and the gate resistance during the switching device is turned off based on different model equations.

7. The gate resistance adjustment device according to claim 6, wherein the calculator calculates each of the model equations based on an equivalent circuit of the switching device.

8. The gate resistance adjustment device according to claim 6, wherein the calculator calculates the model equations fitting experimental waveforms during the switching device is turned on and during the switching device is turned off.

9. The gate resistance adjustment device according to claim 6, wherein the calculator calculates the gate resistance using a first model equation based on a time change of the drain current or the collector current in a first time period during which the switching device is turned on, and calculates the gate resistance using a second model equation based on a time change of the drain voltage or the collector voltage in a second time period following the first time period during which the switching device is turned on, and the setting unit sets a gate resistance of the switching device so as to be switched between the first time period and the second time period during which the switching device is turned on, based on the gate resistance calculated by the calculator.

10. The gate resistance adjustment device according to claim 6, wherein the calculator calculates the gate resistance using a third model equation based on a time change of the drain current or the collector current in a third time period during which the switching device is turned off, and calculates the gate resistance using a fourth model equation based on a time change of the drain voltage or the collector voltage in a fourth time period following the third time period during which the switching device is turned off, and the setting unit sets a gate resistance of the switching device so as to be switched between the third time period and the fourth time period during which the switching device is turned off, based on the gate resistance calculated by the calculator.

* * * * *